(12) United States Patent
Bulovic et al.

(10) Patent No.: US 11,706,883 B2
(45) Date of Patent: Jul. 18, 2023

(54) POWER SEMICONDUCTOR MODULE AND METHOD FOR ARRANGING SAID POWER SEMICONDUCTOR MODULE

(71) Applicant: SEMIKRON ELEKTRONIK GMBH & CO. KG, Nuremberg (DE)

(72) Inventors: Sandro Bulovic, Fürth (DE); Harald Kobolla, Seukendorf (DE)

(73) Assignee: SEMIKRON ELEKTRONIK GMBH & CO. KG, Nuremberg (DE)

(*) Notice: Subject to any disclaimer, the term of this patent is extended or adjusted under 35 U.S.C. 154(b) by 81 days.

(21) Appl. No.: 16/822,903

(22) Filed: Mar. 18, 2020

(65) Prior Publication Data

US 2020/0352041 A1 Nov. 5, 2020

(30) Foreign Application Priority Data

Apr. 30, 2019 (DE) ...................... 10 2019 111 145.5

(51) Int. Cl.
*H05K 5/00* (2006.01)
*H01L 23/00* (2006.01)
(Continued)

(52) U.S. Cl.
CPC ........... *H05K 5/0091* (2013.01); *H01L 24/72* (2013.01); *H01L 25/072* (2013.01); *H05K 5/06* (2013.01)

(58) Field of Classification Search
CPC ...... H05K 5/0091; H05K 5/06; H05K 7/1432; H01L 24/73; H01L 24/72; H01L 24/48;
(Continued)

(56) References Cited

U.S. PATENT DOCUMENTS

2008/0217756 A1* 9/2008 Boettcher ............. H01L 23/051
257/691
2009/0103342 A1* 4/2009 Lin ........................ H01L 24/72
363/125
(Continued)

FOREIGN PATENT DOCUMENTS

DE 1 614 525 8/1970
DE 102006006425 8/2007

OTHER PUBLICATIONS

DE 1 614 525, Examination dated Dec. 13, 2019, 2 pages—English, 5 pages—German.

*Primary Examiner* — Anatoly Vortman
*Assistant Examiner* — Zhengfu J Feng
(74) *Attorney, Agent, or Firm* — Andrew F. Young; Nolte Lackenbach Siegel (57) ABSTRACT

A power semiconductor module contains a power semiconductor assembly, a housing which in a housing side with an outer surface has a recess with a direction of passage in the normal direction of the outer surface, having an internal contact device which has an electrically conducting contact inside the housing to an external connection element, designed as a load terminal element, with one section in the recess and having a spring element. The connection element is designed as a rigid metallic shaped body with an inner and an outer contact surface, and the outer contact surface is accessible from the outside, and the connection element is connected to the housing via an electrically insulating and mechanically elastic retaining device such that the connection element is moveable in the direction of passage, and wherein the spring element is arranged and designed in such a way that the spring action thereof acts directly or indirectly on the connection element in the direction of passage.

11 Claims, 4 Drawing Sheets

(51) Int. Cl.
*H05K 5/06* (2006.01)
*H01L 25/07* (2006.01)

(58) Field of Classification Search
CPC ..... H01L 25/072; H01L 25/18; H01L 23/045; H01L 23/49811; H01L 23/043; H01L 23/48; H01L 2224/48105; H01L 2224/48139; H01L 2224/48227; H01L 2224/4823; H01L 2224/72; H01L 2224/73265; H02K 11/33
USPC .......................................................... 361/730
See application file for complete search history.

(56) References Cited

U.S. PATENT DOCUMENTS

| | | | | |
|---|---|---|---|---|
| 2009/0261472 | A1* | 10/2009 | Bayerer | H01L 24/06 |
| | | | | 257/E23.101 |
| 2015/0173214 | A1* | 6/2015 | Kawazu | H05K 5/0239 |
| | | | | 361/767 |
| 2016/0247735 | A1* | 8/2016 | Lin | H01L 24/72 |
| 2017/0301600 | A1* | 10/2017 | Frank | H01L 23/3672 |

* cited by examiner

POWER SEMICONDUCTOR MODULE AND METHOD FOR ARRANGING SAID POWER SEMICONDUCTOR MODULE

CROSS REFERENCE TO RELATED APPLICATIONS

This application relates to, and claims priority from, DE Ser. No.: 10 2019 111 145.5 filed Apr. 30, 2019, the entire contents of which are incorporated herein by reference.

FIGURE SELECTED FOR PUBLICATION

FIG. 1.

BACKGROUND OF THE INVENTION

Field of the Invention

In general terms the invention describes a power semiconductor module with a power semiconductor arrangement, with a housing and with an internal contact device, which has an electrically conducting contact to an external connection element inside the housing, wherein the connection element is designed as a rigid metallic shaped body with an inner and an outer contact surface. The invention also describes a method for arranging such a power semiconductor module on a motor, preferably on an electric motor of a road vehicle. The term 'electric motor' as used here is to be understood generally to mean an electrical machine which can be operated as both a motor and a generator.

Description of the Related Art

For example, DE 10 2006 006 425 A1 discloses a standard power semiconductor module in a pressure contact design, which is designed for arrangement on a cooling component, in which load terminal elements are implemented in each case as a metal shaped body with at least one strip-like section and with a plurality of contact feet emanating therefrom. In this case, one strip-like section of the load terminal element is arranged parallel to the substrate surface and spaced apart from it. In addition, the contact feet extend from the strip-like section to the substrate and there form circuit-compatible contacts for the load terminals. Between the strip-like section of the load terminal elements and the substrate a shaped insulator body is arranged, and this has recesses for the contact feet to pass through.

ASPECTS AND SUMMARY OF THE INVENTION

Having regard to the prior art, the object of the invention, in particular, is to refine the design and arrangement of an external, i.e. outwardly extending, connection element in such a way that as part of a refined method the power semiconductor module can be arranged easily in relation to a motor, in particular, an electric motor.

This object is achieved according to the invention by a power semiconductor module having a power semiconductor assembly, a housing which in a housing side with an outer surface has a recess with a direction of passage in the normal direction of said outer surface, having an internal contact device which has an electrically conducting contact inside the housing to an external connection element, in particular designed as a load terminal element, with one section arranged in the recess, and having a spring element, wherein the connection element is designed as a rigid metallic shaped body with an inner and an outer contact surface, wherein the outer contact surface is accessible from the outside, wherein the connection element is connected to the housing via an electrically insulating and mechanically elastic retaining device such that said connection element is moveable in the direction of passage, and wherein the spring element is arranged and designed in such a way that the spring action thereof acts directly or indirectly on the connection element in the direction of passage.

It is particularly advantageous if the connection element has a first connection element position relative to the direction of passage, in which the outer contact surface has a first contact surface position relative to the outer surface, and wherein the connection element can be displaced in the negative direction of passage against a spring force of the spring element.

It can be advantageous in each case if the first contact surface position is recessed in the direction of passage relative to the outer surface, or is formed flush with the outer surface or protrudes through the outer surface.

On the one hand, it can be preferable if the spring element is designed to press on the internal contact device on the inner contact surface of the connection element in the direction of passage and if the internal contact device is arranged between the spring element and the connection element for this purpose. On the other hand, the internal contact device can have a sleeve in which a section of the connection element and the spring element are arranged.

In principle, it is advantageous if the housing side is designed as a base plate and thus the recess is arranged in this base plate. At the same time, the base plate can have a cooling device, in particular a fluid cooling device.

The internal contact device is preferably designed as an integral component of the power semiconductor assembly; in particular an integral component of a substrate of the power semiconductor assembly, or else the internal contact device is electrically conductively connected to the power semiconductor assembly, in particular to the substrate thereof.

In an advantageous manner, the spring element is implemented as a spiral spring or as a Belleville spring or as an elastomer.

It is advantageous if the mechanically elastic retaining device is implemented as a sealing device which encloses the connection element on all sides in one section and seals the recess against environmental influences.

Preferably, the mechanically elastic retaining device is securely mounted in the housing by means of a fixing device.

It can be particularly advantageous if the housing additionally contains a control circuit board, a capacitor device, or both.

The object is additionally achieved by a method for arranging an above-mentioned power semiconductor module on a motor which has a motor contact device for electrically conductively connecting to the power semiconductor module, having the method steps: deploying the power semiconductor module, wherein the outer contact surface is located relative to the outer surface of the housing side of the housing of the power semiconductor module in the first contact surface position; arranging the power semiconductor module with respect to a power module surface of the motor, in such a way that the outer contact surface of the connection element of the power semiconductor module comes to rest on the motor contact device assigned to said outer contact surface, wherein the outer contact surface remains in the first contact surface position relative to the outer surface; securing the power semiconductor module with the outer surface thereof on the power module surface by means of a mounting device, wherein the outer contact surface is displaced in the negative direction of passage from the first into a second contact surface position, as a result of which an electrically conducting pressure contact generated by the spring element of the power semiconductor module is formed between the outer contact surface and the associated motor contact device.

It can be advantageous if a sealing device is arranged between the power module surface and the outer surface. The sealing device can be arranged surrounding the position of the connection element.

It is preferable if the sealing device is implemented as a static, self-sealing and removable sealing device, in particular as a flat seal, as a profiled gasket and here, in particular, as an O-ring seal.

Of course, provided this is not explicitly or inherently excluded or does not contradict the idea of the invention, each of the features or groups of features referred to in the singular, in particular the external load terminal element, or groups of features, may be present more than once in the power semiconductor module according to the invention.

It goes without saying that the various embodiments of the invention, either individually or in any combination and regardless of whether they are described in the context of the power semiconductor module or the method, can be implemented in order to achieve improvements. In particular, the above features and those mentioned below can be applied not only in the specified combinations, but also in other combinations or in isolation, without departing from the scope of the present invention.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'fink' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIGS. 1 to 4 show various embodiments of a power semiconductor module 1 according to the invention in cross-section. The respective power semiconductor module 1 has a housing 7, which without restriction of generality is designed here in two parts with a metallic base plate 72 and a cup-like plastic body 70. Such embodiments are essentially standard in the art.

The power semiconductor module 1 also has a power semiconductor assembly 2, which in the standard manner has a substrate that electrically insulates the power semiconductor assembly 2 from the base plate 72. On this substrate a plurality of conductor tracks, not explicitly shown, are arranged with power semiconductor devices placed thereon and connected in a circuit-compatible manner.

Figure 1:
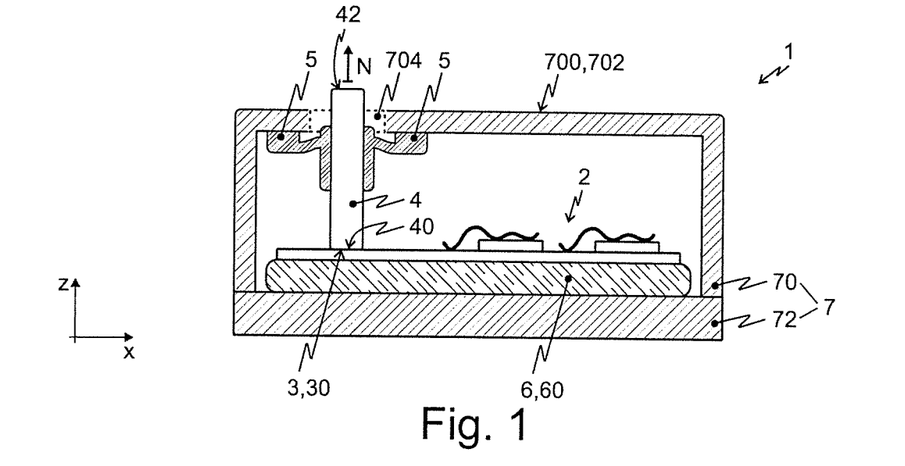
FIGS. 1 to 4 show various embodiments of a power semiconductor module according to the invention in cross-section.

In the embodiment according to FIG. 1 between the substrate and the base plate 72 an elastic cushion-like element 60 is arranged, in this case formed of a permanently elastic industrial rubber. This cushion-like element 60 forms the spring element 6 of the power semiconductor module 1.

The housing 7, here the cup-shaped housing part 70, has a housing side 700, here the top side of the housing 7, with an outer surface 702 and a recess 704 which extends through the side of the housing. One section of a connection element 4 protrudes through this recess 704 of the housing 7. The connection element 4 is designed as a rigid, in other words differing from standard common material properties, non-elastic, metallic shaped body with an inner and an outer contact surface 40, 42. The outer contact surface 42 is used to connect the power semiconductor module 1, in particular to a motor, and is accessible from the outside for this purpose.

The power semiconductor module 1 also has an electrically insulating and mechanically elastic retaining device 5. This retaining device 5 is connected, on the one hand, to the housing 7 of the power semiconductor module 1 and, on the other hand, to the connection element 4. The section between these connections is the area which essentially provides the elasticity of the retaining device. To this end the connection element 4 is encapsulated with the retaining device 5 and the retaining device is connected to the housing 7 in a standard way, here using adhesive techniques.

By means of this electrically insulating and mechanically elastic retaining device 5 and, in particular, by means of the above-mentioned section, the connection element 4 is arranged to be movable in the recess 704 in the normal direction N of the outer surface 702 of the housing side 700.

The internal contact device 3 here is designed as an integral component 30 of the power semiconductor assembly 2, in particular as a component, here more precisely as a section, of a conductor track of the substrate of the power semiconductor assembly 2. This section of the conductor track is connected to the external connection element 4, which here is designed as a load terminal element, in a materially-bonded and thus directly electrically conducting manner. Of course, at the same time a connection medium, for example a solder, but no other object, can be arranged between the inner contact surface 40 of the connection element 4 and the section of the conductor track. The connection between the internal contact device 3 and the connection element 4 is in this case formed directly. An alternative embodiment of the direct connection between the internal contact device 3 and the inner contact surface 40 is a force-fitting connection. This may even be an advantage, in particular in conjunction with the arrangement of the power semiconductor module 1 directly on a motor, since due to potentially high ambient temperatures, the materially-bonded connection, in particular a solder connection, does not have sufficient durability.

Figure 7:
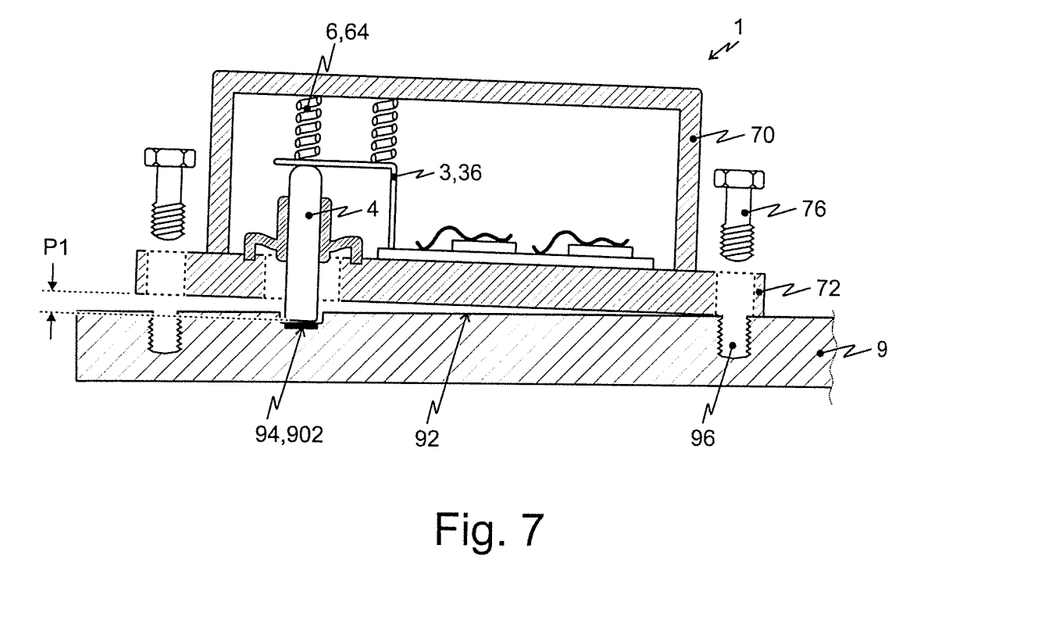
FIG. 7 shows the completed step b) of the method according to the invention.

The spring element 6, the internal contact device 3, the connection element 4 and the retaining device 5 interact in such a way that the connection element 4 is pressed outwards through the recess in the normal direction N as far as a connection element position in which the outer contact surface 42 is in a first contact surface position P1, see FIG. 7. In doing so the spring element 6 acts on the connection element 4 indirectly via the substrate. In the process, the outer contact surface 42 protrudes from the housing 7 through the outer surface 702. In the case of an external force application in the negative normal direction N, the connection element 4 can be displaced in this direction against the spring force of the spring element 6.

Figure 2:
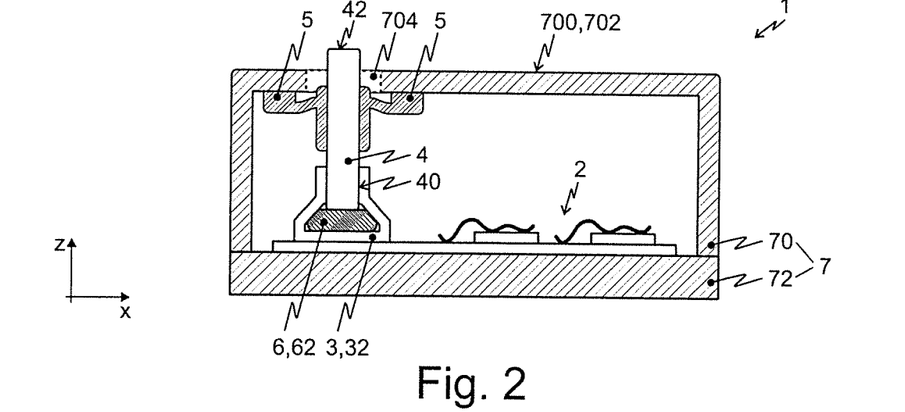

In the design according to FIG. 2 the power semiconductor module 1 has no spring element 6 between the substrate of the power semiconductor assembly 2 and the base plate 72, but these are connected to each other in a standard, thermally conductive manner instead.

In addition, the internal contact device 3 here is designed as a metallic sleeve 32, which here is connected to the substrate, more precisely to a section of a conductor track of the substrate, in a materially-bonded manner. The end section of the connection element 4 associated with the inner contact surface 40 of this connection element 4 is arranged in this sleeve 32, and connected in a force-fitting and electrically conducting manner to an inner surface of the sleeve 32. This sleeve 32 is widened in its base region where it has an elastomer 62, here formed of a permanently elastic industrial rubber, which forms the spring element 6 of this power semiconductor module 1. Here, the connection element 4 is in direct mechanical contact with this spring element 6.

In addition, the power semiconductor module 1 is designed similarly to that in accordance with FIG. 1 and has essentially the same functionality, in particular with regard to the interaction of the internal contact device 3, the spring element 6, the connection element 4 and the retaining device 5. However, here the spring device 6 acts directly upon the connection element 4.

Figure 3:
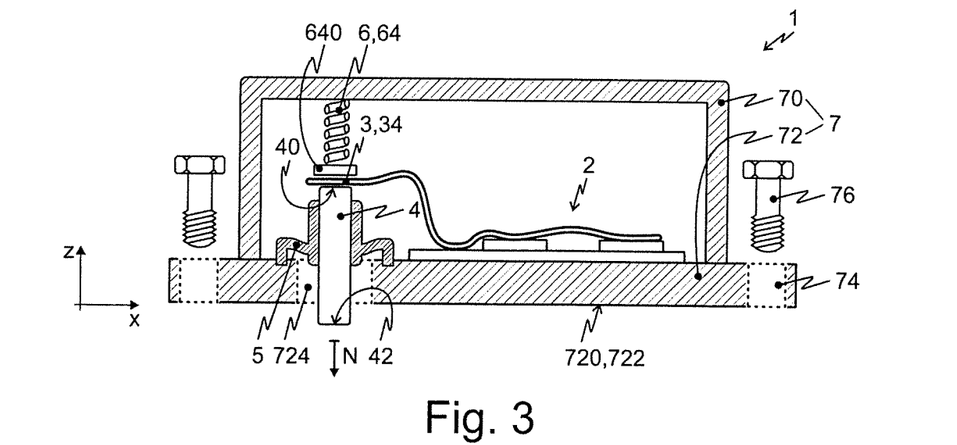

In the embodiment according to FIG. 3 the power semiconductor module 1 has a base plate 72, the two through holes 74 for screws 76, which here form part of a mounting device and which are used for mounting the power semiconductor module 1, in particular on a motor. Furthermore, in this embodiment of the power semiconductor module 1 the base plate 72 comprises the recess 724 in which a section of the connection element 4 is arranged. The connection element 4 therefore protrudes from inside the housing 7 through the base plate 72 in such a way that its inner contact surface 40 is positioned inside the housing 7 of the power semiconductor module 1 and its outer contact surface 42 protrudes through the outer surface 722 of the base plate 72.

The electrically insulating and mechanically elastic retaining device 5 is here connected to the base plate 72 by means of recesses therein. It also comprises a section of the connection element 4 and thus additionally ensures the electrical insulation of the connection element 4 from the metallic base plate 72. Although not shown, a separate insulation device can also enclose the connection element in a necessary section to provide the electrical insulation.

The retaining device 5 is also used for flexibly supporting the connection element 4 relative to the base plate 72 and the recess 724 thereof. This flexible mounting allows, at least, a mobility of the connection element 4 in the normal direction N of the base plate 72 and thus a change in the contact surface position of the outer contact surface 42 relative to the outer surface 724 of the base plate 72, more generally of the outer surface of the housing side that comprises the recess.

The internal contact device 3 of this embodiment of the power semiconductor module 1 here is a section of an internal connection device 34 of the power semiconductor assembly 2. This internal connection device 34 here is designed as a standard stack consisting of electrically conducting and electrically insulating films, which if necessary have vias (pathways) between electrically conductive layers through one or more electrically insulating layers.

The internal contact device 3 is in direct electrically conducting pressure contact with the inner contact surface 40 of the connection element 4. This pressure contact is generated by means of a spring element 6, which is implemented here as a spiral spring 64 with a spring axis or spring direction parallel to the normal direction N. Since in this embodiment the spiral spring 64 is formed from a metallic material, an insulator body 640 is located between the end of the spiral spring and the internal contact device 34, which here additionally performs the function of transmitting the pressure of the spiral spring 64 homogeneously onto the internal connection device 34.

Also implemented in this embodiment of the power semiconductor module 1 is the essentially identical functionality, in particular with regard to the interaction of the internal contact device 3, the spring element 6, the connection element 4 and the retaining device 5, to that shown in the above two variants in accordance with FIGS. 1 and 2.

Figure 4:
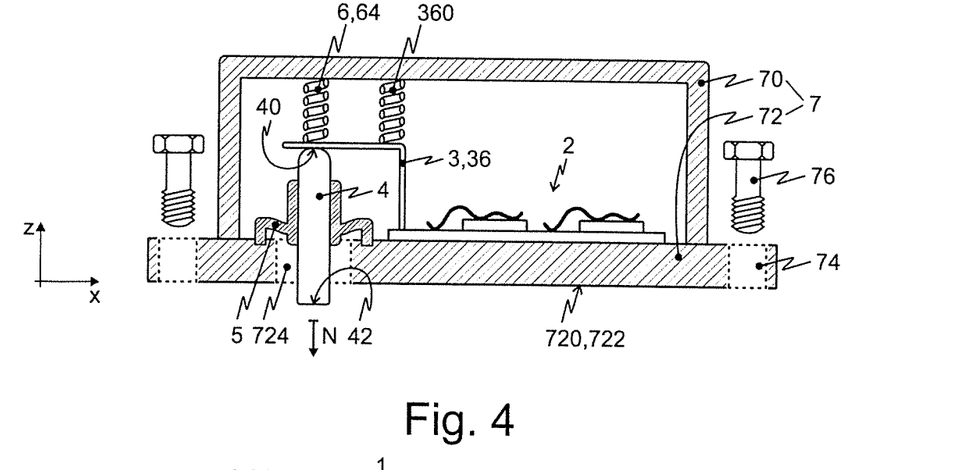

In the design according to FIG. 4 the power semiconductor assembly 1 is designed essentially analogously to that in accordance with FIGS. 1 and 2. However, here the internal contact device 3 is not an integral part of the power semiconductor assembly 2. Instead, an L-shaped metal shaped body 36 forms this internal contact device 3. This metal shaped body 36 has a section parallel, or at least approximately parallel, to the base plate 72. Two spiral springs 64,360 press on this parallel section. A first spiral spring 64, which forms the spring element 6 of the power semiconductor module 1, presses a sub-section of the parallel section directly onto the inner contact surface 40 of the connection element 4, thus forming an electrically conducting contact between them. The other spring 360 presses a section of the internal contact device 36 running perpendicular to the base plate 72 onto a conductor track of the substrate and therefore contacts the power semiconductor assembly 2.

Also implemented in this embodiment of the power semiconductor module 1 is the essentially identical functionality, in particular with regard to the interaction of the internal contact device 3, the spring element 6, the connection element 4 and the retaining device 5, to that in the variants mentioned above in accordance with FIG. 3.

Figures 5, 6:
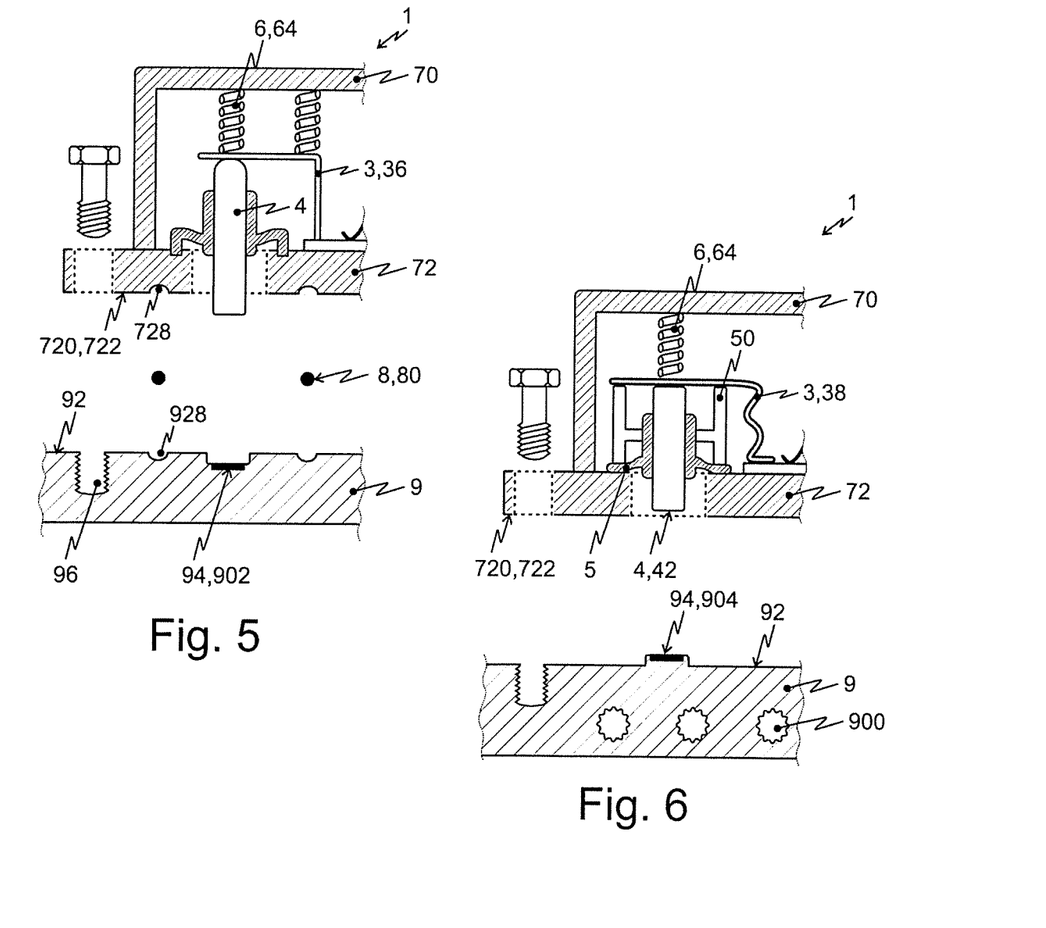
FIGS. 5 and 6 show a power semiconductor module according to the invention before step b) of the method according to the invention.

FIGS. 5 and 6 each show a power semiconductor module 1 according to the invention and a part of an electric motor 9 before step b) of the method according to the invention. The power semiconductor module 1 according to FIG. 5 is essentially identical to that according to FIG. 4, except that on its outer surface 724 of the base plate 72 it has a groove 728 running around the recess 724, which is designed for partially receiving a sealing device 8, here an O-ring seal 80.

The motor 9 has a power module surface 92 which is designed so that the power semiconductor module 1 comes to rest with its outer surface 722 flush on this power module surface 92. This power module surface 92 also has a groove 928 which is aligned with the groove 728 of the base plate 72 and interacts with it in such a way that the O-ring seal 80 comes to rest in both grooves and after the mounting of the power semiconductor module 1 on the power module surface 92 therefore seals the recess 724 against environmental influences, here even against pressurized water.

Furthermore, the motor 9 has a thread 96 which interacts with the screw 76 of the power semiconductor module 1 and forms the mounting device.

In a recess 902, relative to the surface of the power module surface 92 of the motor 9, a motor contact device 94 is arranged, which together with the outer contact surface 42 of the connection element 4 is designed to form the electrically conducting contact of the power semiconductor module 1 with the motor 9. In this, as in all previous power semiconductor modules 1, the first contact surface position P1 protrudes in the direction of passage N relative to the outer surface 722.

The power semiconductor module 1 according to FIG. 6, in contrast to that in accordance with FIG. 5, has an internal contact device 3 which is connected in a materially-bonded manner to a conductor track of the substrate and has a length compensation structure perpendicular to the base plate 72. Furthermore, the power semiconductor module 1 has a fixing device 50 which clamps a section of the retaining device 5 against the housing 7 and thus fixes it to, here more precisely in, the housing 7.

In an elevation 904, relative to the surface of the power module surface 92 of the motor 9 a motor contact device 94 is arranged, which together with the outer contact surface 42 of the connection element 4 is designed to form the electrically conducting contact of the power semiconductor module 1 with the motor 9. In this embodiment of the semiconductor module 1, the first contact surface position P1 is recessed relative to the outer surface 722 in the direction of passage N.

In addition, the motor 9 here additionally has a liquid cooling device 900 for cooling the power semiconductor module 1. This is particularly preferred if the base plate 72 itself has no explicit cooling device.

FIG. 7 shows the completed step b) of the method according to the invention. In this case a power semiconductor module 1, purely as an example and because it is useful for the explanation of the method, one according to FIG. 4, is arranged on the power module surface 92 of the motor 9, without yet exerting an external force on the power semiconductor module 1. Therefore, the first contact surface position P1 relative to the outer surface 722 is that which is defined by the interaction of the internal components. In this case, of course, the associated parts of the mounting devices 76,96 are each arranged relative to each other aligned in the normal direction, with a slight tilt. Likewise, the motor contact device 94 and the outer contact surface 42 of the connection element 4 are aligned in the normal direction and again slightly tilted relative to each other.

Figure 8:
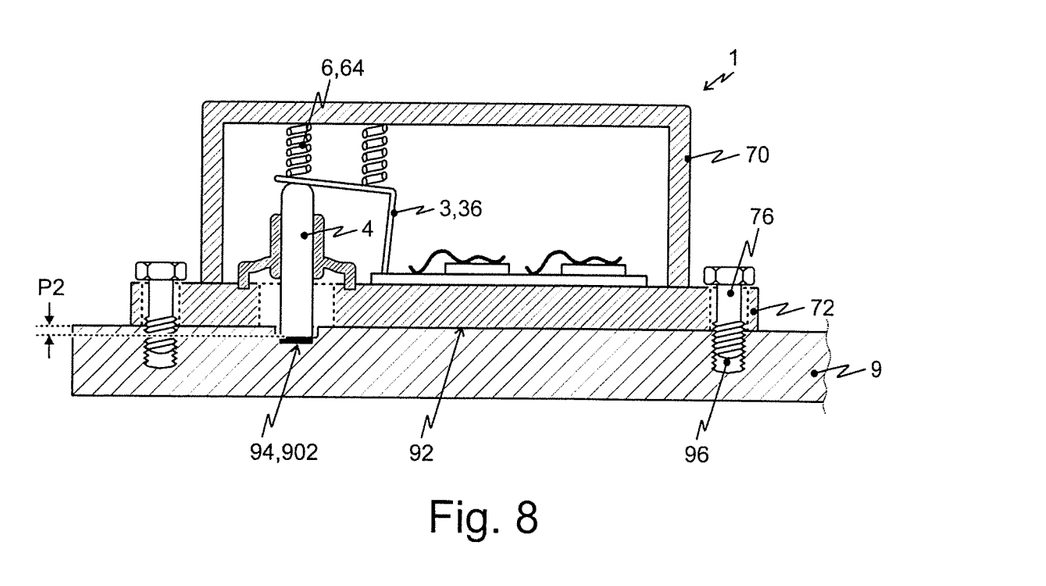
FIG. 8 shows the completed step c) of the method according to the invention.

FIG. 8 shows the completed step c) of the method according to the invention. During the method step c) the power semiconductor module 1 is fixed with its outer surface 724 flush on the power module surface 92 of the motor 9 by means of the respectively associated parts of the mounting devices 76,96. As a result the connection element 4 is displaced in the negative normal direction N against the action of the spring device 6. This causes the outer contact surface 42 to arrive at the second contact surface position P2, which is shifted in the negative normal direction N relative to the first contact surface position P1. In other words, the outer contact surface 42 protrudes relative to the surface 722 of the housing side 720, here the base plate 72, by a lesser amount after the assembly than before the assembly. Due to the assembly the spring element 6 is tensioned for the first time or more strongly, causing an electrically conducting pressure contact to be formed between the outer contact surface 42 and the motor contact device 94. Of course, this means that the internal contact device 36 is now tilted. In other embodiments, in particular according to FIGS. 3 and 6, such a tilting of the internal contact device 3 is either lower or non-existent.

Figure 9:
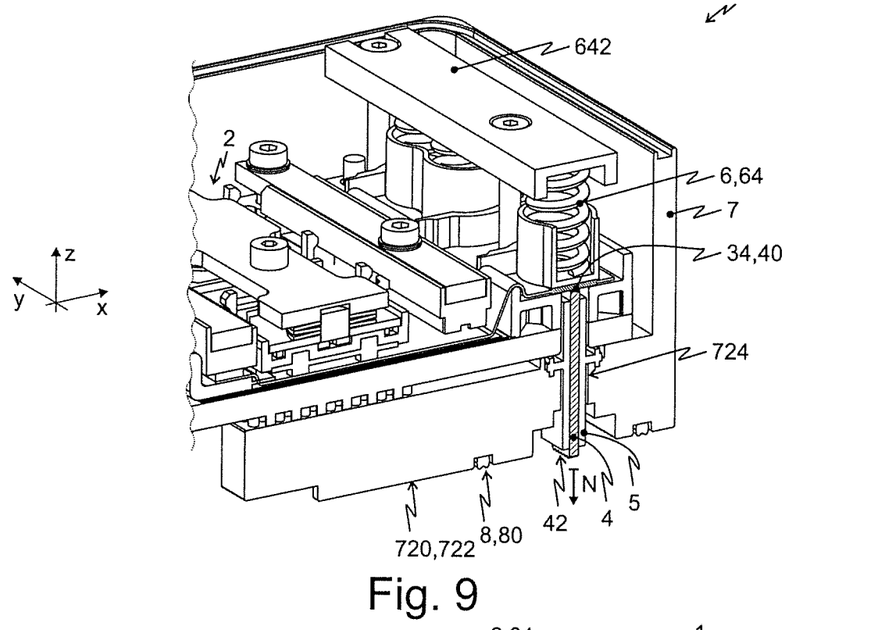
FIGS. 9 and 10 show various embodiments of a power semiconductor module according to the invention in a three-dimensional sectional view.
Figure 10:
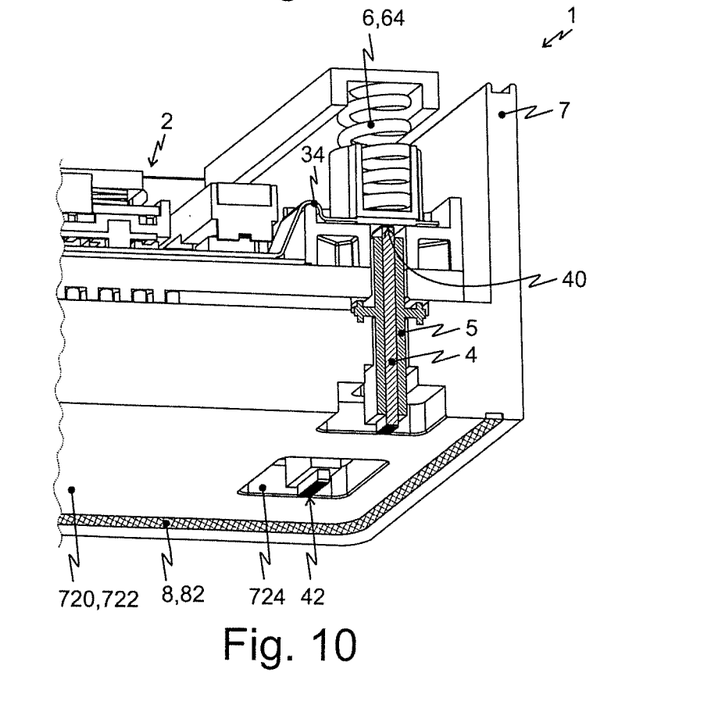

FIGS. 9 and 10 show various, but similar, embodiments of a power semiconductor module according to the invention 1 in a three-dimensional sectional view. Also shown again is a housing 7, in this case a cup-shaped metal housing with a plastic cover, not shown. The metal housing 7 has on its base, the housing side 720 which forms the housing surface 722, two recesses 724, see FIG. 10. In the design according to FIG. 10, the housing side 720 has another sealing device 8, here a flat seal 82, extending around its edge, which interacts in a sealing manner with a power module surface, not shown, of a motor.

A power semiconductor assembly 2 is arranged inside each housing 7. This points to a film composite 34, as has been already described in outline in FIG. 3, which also forms the internal contact device 3 to a connection element 4. The connection element 4 itself is designed as a rigid metallic shaped body with an inner and an outer contact surface 40,42. This shaped body is almost completely enclosed in the normal direction N by a retaining device 5, which effectively only leaves the regions of the contact surfaces 40,42 exposed. This retaining device 5 encloses the connection element and has sections with which it is arranged in the housing 7 in a force-fitting manner. The retaining device is designed to be not only electrically insulating, therefore additionally as a sealing device which seals the inside of the power semiconductor module 1, even without its being arranged on a motor, against environmental effects such as dust and moisture.

The retaining device 5 alone ensures that the connection element 4 is arranged in the recess 724 with limited mobility in the normal direction N. A spring device 6, essentially analogous to that according to FIG. 3, is designed and dimensioned in such a way that it presses the connection element 4 in the normal direction N slightly out of a rest position, the one without a positioned spring element 6. The outer contact surface 42 is thus located in a first contact surface position relative to the outer surface 722. Due to the mounting, not shown, by means of a mounting device of the power semiconductor module 1 on a motor, wherein the outer surface 722 rests flush on a power module surface of the motor, the outer contact surface 42 is displaced in the negative direction N from the first into a second contact surface position P1, P2, cf. FIGS. 7 and 8. In addition, electrically conducting pressure contact, generated by the spring element 6 of the power semiconductor module 1, is formed between the inner contact surface 40 and the internal contact device 34 as well as between the outer contact surface 42 and the associated motor contact device.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A method for arranging a power semiconductor module, on a motor which comprises a motor contact device, comprising the steps of:
   a) providing said power semiconductor module, said power semiconductor module further comprising:
      a power semiconductor assembly having a housing which, in a housing side with an outer surface, has a recess with a direction of passage in a normal direction (N) of said outer surface;
      an internal contact device, which has an electrically conducting contact inside the housing to an external connection element, designed as a load terminal element, with one section arranged in the recess, and having a spring element;
      the external connection element is designed as a rigid metallic shaped body with an inner and an outer contact surface;
      wherein the outer contact surface is accessible from the outside;
      the external connection element is connected to the housing via an electrically insulating and mechanically elastic retaining device such that said external connection element is moveable in a direction of the recess;
      wherein the spring element is arranged and designed in such a way that a spring action of the spring element acts directly or indirectly on the external connection element in the direction of the recess;
      wherein the external connection element has a first connection element position relative to the direction of passage, in which the outer contact surface relative to the outer surface has a first contact surface position (P1);
      wherein the external connection element can be displaced in a negative direction (N) of passage against a spring force of the spring element;
      wherein the first contact surface position (P1) is recessed in the direction of passage in relation to the outer surface, or is formed flush with the outer surface or protrudes through the outer surface; and
      wherein the spring element is designed to press on the internal contact device) on the inner contact surface of the external connection element in the direction of passage and wherein the internal contact device is arranged between the spring element and the external connection element for this purpose;
   b) deploying the power semiconductor module, wherein the outer contact surface is located relative to the outer surface of the housing side of the housing of the power semiconductor module in the first contact surface position (P1);
   c) arranging the power semiconductor module with respect to a power module surface of the motor, in such a way that the outer contact surface of the external connection element of the power semiconductor module comes to rest on the motor contact device associated with said outer contact surface, wherein the outer contact surface remains in the first contact surface position (P1) relative to the outer surface; and
   d) fixing the power semiconductor module with the outer surface thereof on the power module surface by means of a mounting device, wherein the outer contact surface is displaced in the negative direction (N) of passage from the first contact surface position (P1) into a second contact surface position (P2), as a result of which an electrically conducting pressure contact generated by the spring element of the power semiconductor module is formed between the outer contact surface and the associated motor contact device.

2. The method, according to claim 1, wherein:
the internal contact device has a sleeve in which a section of the external connection element and the spring element are arranged.

3. The method, according to claim 1, wherein:
the housing side is designed as a base plate and the recess is arranged in the base plate.

4. The method, according to claim 1, wherein:
the internal contact device is designed as:
an integral component that is a substrate of the power semiconductor assembly; and
is electrically conductively connected to the power semiconductor assembly at the substrate thereof.

5. The method, according to claim 1, wherein:
the spring element is implemented as one of a spiral spring, a Belleville spring, and an elastomer.

6. The method, according to claim 1, wherein:
the mechanically elastic retaining device is implemented as a sealing device, which encloses the external connection element on all sides in the one section and seals the recess.

7. The method, according to claim 1, wherein:
the mechanically elastic retaining device is securely mounted in the housing by means of a fixing device.

8. The method, according to claim 1, wherein:
the housing additionally contains at least one of a control circuit board, a capacitor device.

9. The method, according to claim 1, wherein:
a sealing device is arranged between the power module surface and the outer surface.

10. The method, according to claim 9, wherein:
the sealing device is arranged surrounding the first connection element position of the external connection element.

11. The method, according to claim 10, wherein:
the sealing device is implemented as a static, self-sealing and removable sealing device, as one of a flat seal, a profiled gasket and as an O-ring seal.

* * * * *